(12) United States Patent
Onimaru et al.

(10) Patent No.: US 9,728,741 B2
(45) Date of Patent: Aug. 8, 2017

(54) ORGANIC EL PANEL, METHOD FOR PRODUCING SAME, AND COLOR FILTER SUBSTRATE

(71) Applicant: JOLED INC., Tokyo (JP)

(72) Inventors: Toshiaki Onimaru, Tokyo (JP); Takayuki Shimamura, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/037,347

(22) PCT Filed: Nov. 14, 2014

(86) PCT No.: PCT/JP2014/005735
§ 371 (c)(1),
(2) Date: May 18, 2016

(87) PCT Pub. No.: WO2015/079641
PCT Pub. Date: Jun. 4, 2015

(65) Prior Publication Data
US 2016/0276623 A1    Sep. 22, 2016

(30) Foreign Application Priority Data

Nov. 26, 2013  (JP) .................................. 2013-243528

(51) Int. Cl.
*H01L 51/52* (2006.01)
*G02B 5/20* (2006.01)
(Continued)

(52) U.S. Cl.
CPC ............ *H01L 51/5246* (2013.01); *G02B 1/18* (2015.01); *G02B 5/201* (2013.01); *H01L 27/322* (2013.01);
(Continued)

(58) Field of Classification Search
CPC ....... G02B 1/18; G02B 5/201; H01L 27/3211; H01L 27/322; H01L 51/5246;
(Continued)

(56) References Cited

U.S. PATENT DOCUMENTS

| 5,443,922 | A | 8/1995 | Nishizaki et al. |
| 5,990,615 | A | 11/1999 | Sakaguchi et al. |

(Continued)

FOREIGN PATENT DOCUMENTS

| JP | 05-089959 | 4/1993 |
| JP | 05-163488 | 6/1993 |

(Continued)

OTHER PUBLICATIONS

International Search Report (ISR) from International Searching Authority (Japan Patent Office) in International Pat. Appl. No. PCT/JP2014/005735, dated Feb. 17, 2015.

*Primary Examiner* — Allan R Wilson
(74) *Attorney, Agent, or Firm* — Greenblum & Bernstein, P.L.C.

(57) ABSTRACT

An organic EL panel includes: an organic EL substrate; a color filter substrate; and a resin layer, wherein the organic EL substrate and the color filter substrate are adhered to each other via the resin layer, the color filter substrate further includes a moisture absorbent layer, the moisture absorbent layer being vapor-deposited on the colored layers, facing the resin layer, and containing magnesium oxide, and a temperature of the second substrate during vapor deposition of the moisture absorbent layer is 200 degrees Celsius or lower.

9 Claims, 6 Drawing Sheets (51) Int. Cl.
  *H01L 51/00*  (2006.01)
  *G02B 1/18*  (2015.01)
  *H01L 27/32*  (2006.01)
(52) U.S. Cl.
  CPC ...... *H01L 27/3211* (2013.01); *H01L 51/0024* (2013.01); *H01L 51/52* (2013.01); *H01L 51/5259* (2013.01); *H01L 51/5284* (2013.01); *H01L 2251/303* (2013.01)
(58) Field of Classification Search
  CPC . H01L 51/52; H01L 51/5284; H01L 51/0024; H01L 51/5259
  See application file for complete search history.

(56) References Cited

U.S. PATENT DOCUMENTS

| | | | |
|---|---|---|---|
| 7,166,872 B2* | 1/2007 | Miyazawa | G02F 1/133553 257/98 |
| 2003/0006698 A1* | 1/2003 | Mayuzumi | H05B 33/04 313/506 |
| 2005/0045065 A1* | 3/2005 | Sakurai | C04B 35/053 106/286.8 |
| 2008/0036367 A1 | 2/2008 | Eida et al. | |
| 2009/0115325 A1 | 5/2009 | Matsuzaki et al. | |
| 2014/0240617 A1* | 8/2014 | Fukutome | G02F 1/13338 349/12 |
| 2016/0334553 A1* | 11/2016 | Wu | G02F 1/1335 |

FOREIGN PATENT DOCUMENTS

| | | |
|---|---|---|
| JP | 07-169567 | 7/1995 |
| JP | 10-275682 | 10/1998 |
| JP | 2003-257666 | 9/2003 |
| JP | 2004-006133 | 1/2004 |
| JP | 2004-039579 | 2/2004 |
| JP | 2004-095233 | 3/2004 |
| JP | 2004-197140 | 7/2004 |
| JP | 2006-123289 | 5/2006 |
| JP | 2007-042499 | 2/2007 |
| JP | 2007-184290 | 7/2007 |
| JP | 2007-250437 | 9/2007 |
| JP | 2008-166244 | 7/2008 |
| JP | 2009-117180 | 5/2009 |
| WO | 2006/022123 | 3/2006 |

* cited by examiner

| Sample | Substrate temperature (°C) | Refractive index | (111) intensity (cts/μm) | Thermal resistance of colored layers of CF substrate |
|---|---|---|---|---|
| Example 1 | 140 | 1.639 | 2380 | OK |
| Example 2 | 180 | 1.624 | 2420 | OK |
| Comparative example 1 | 230 | 1.669 | 2100 | NG |
| Comparative example 2 | 260 | 1.691 | 1750 | NG |
| Comparative example 3 | 300 | 1.669 | 1690 | NG |
| Comparative example 4 | 340 | 1.672 | 1520 | NG |

ORGANIC EL PANEL, METHOD FOR PRODUCING SAME, AND COLOR FILTER SUBSTRATE

TECHNICAL FIELD

The present disclosure relates to an organic EL panel, a method of manufacturing the same, and a color filter substrate.

BACKGROUND ART

In recent years, there have been increasingly widespread organic EL panels including organic EL elements formed on a substrate. Commercialization of organic EL televisions seems to be nearing reality. Colorization methods of organic EL panels includes a known method of combining organic EL elements of the top emission type and a color filer (hereinafter, abbreviated as CF) substrate. According to this method, specifically, an organic EL substrate on which the organic EL elements are formed and the CF substrate on which colored layers are formed are adhered to each other via a resin layer such that the organic EL elements and the colored layers face each other. The organic EL elements of the top emission type employing the CF method fall into two types of organic EL elements emitting white light and organic EL elements each emitting light of any one of red (R), green (G), and blue (B) colors that are arranged in parallel. In the latter case, the CF substrate is used in order to increase the color purity of the organic EL elements emitting each emitting light of any one of R, G, and B colors to widen the color reproduction range of an organic EL panel.

Organic EL elements have an advantage of being highly visible resulting from self-luminescence, but have a disadvantage of being vulnerable to moisture. Accordingly, moisture intrusion from inside and outside an organic EL panel might cause generation of non-light emitting parts (dark spots) in a display region of the organic EL panel or decrease in luminance of the display region. Therefore, it is important how to remove moisture in order to put organic EL panels into practical use.

In view of this, there has conventionally been considered a method of providing a moisture absorbent layer in an organic EL panel. Known materials of the moisture absorbent layer include magnesium oxide, calcium oxide, and strontium oxide (Patent Literature 1). Magnesium oxide and so on are excellent in both transparency and moisture absorption property.

CITATION LIST

Patent Literature

[Patent Literature 1] Japanese Patent Application Publication No. 2004-95233
[Patent Literature 2] Japanese Patent Application Publication No. H5-89959
[Patent Literature 3] Japanese Patent Application Publication No. H7-169567

SUMMARY OF INVENTION

Technical Problem

However, there has been a case where moisture exists in colored layers included in a CF substrate in an organic EL panel of the top emission type employing the CF method, and it has increasingly become acknowledged as a problem that if the moisture reaches organic EL elements through a resin layer, the luminous property degrades. In response to this problem, it is considered to provide a moisture absorbent layer on the colored layers included in the CF substrate. However, formation of a moisture absorbent layer containing magnesium oxide or the like sometimes degrades the colored layers included in the CF substrate depending on the temperature during the formation. Further, since the CF substrate is disposed on the light extraction side, light emitted from the organic EL elements transmits through the moisture absorbent layer. In the case where magnesium oxide is for example used as the moisture absorbent layer, a large difference exists in refractive index between the moisture absorbent layer and the resin layer adjacent thereto because common magnesium oxide is higher in refractive index than the resin layer. This causes interface reflection between the moisture absorbent layer and the resin layer, and thus decreases the light utilization efficiency.

In view of the above problem, the present disclosure aims to provide an organic EL panel in which thermal degradation of colored layers included in a CF substrate is suppressed and decrease of the utilization efficiency of emitted light is suppressed.

Solution to Problem

In order to solve the above problem, one aspect of the present disclosure provides an organic EL panel comprising: an organic EL substrate that includes a first substrate and organic EL elements disposed on the first substrate; a color filter substrate that includes a second substrate and colored layers disposed on the second substrate; and a resin layer, wherein the organic EL substrate and the color filter substrate are adhered to each other via the resin layer such that the organic EL elements and the colored layers face each other, the color filter substrate further includes a moisture absorbent layer, the moisture absorbent layer being vapor-deposited on the colored layers, facing the resin layer, and containing magnesium oxide, and a temperature of the second substrate during vapor deposition of the moisture absorbent layer is 200 degrees Celsius or lower.

Advantageous Effects of Invention

The organic EL panel relating to the one aspect of the present disclosure includes the moisture absorbent layer containing magnesium oxide that is obtained by vapor deposition at a substrate temperature of 200 degrees Celsius or lower. By setting the substrate temperature to 200 degrees Celsius or lower, it is possible to suppress thermal degradation of colored layers included in a common CF substrate. Further, it is possible to reduce the difference in refractive index between the moisture absorbent layer and the resin layer compared with the case where common magnesium oxide is used.

This makes it possible to provide an organic EL panel in which thermal degradation of colored layers included in a CF substrate is suppressed and decrease of the utilization efficiency of emitted light is suppressed.

DESCRIPTION OF EMBODIMENTS

The following explains an embodiment of the present disclosure in detail, with reference to the drawings.
(Embodiment)
<Aspect of the Disclosure>

One aspect of the present disclosure provides an organic EL panel comprising: an organic EL substrate that includes a first substrate and organic EL elements disposed on the first substrate; a color filter substrate that includes a second substrate and colored layers disposed on the second substrate; and a resin layer, wherein the organic EL substrate and the color filter substrate are adhered to each other via the resin layer such that the organic EL elements and the colored layers face each other, the color filter substrate further includes a moisture absorbent layer, the moisture absorbent layer being vapor-deposited on the colored layers, facing the resin layer, and containing magnesium oxide, and a temperature of the second substrate during vapor deposition of the moisture absorbent layer is 200 degrees Celsius or lower.

Also, according to the one aspect of the present disclosure, the moisture absorbent layer may further include at least one of calcium oxide and strontium oxide.

Also, according to the one aspect of the present disclosure, the magnesium oxide contained in the moisture absorbent layer may be (111)-oriented.

Another aspect of the present disclosure provides an organic EL panel comprising: an organic EL substrate that includes a first substrate and organic EL elements disposed on the first substrate; a color filter substrate that includes a second substrate and colored layers disposed on the second substrate; and a resin layer, wherein the organic EL substrate and the color filter substrate are adhered to each other via the resin layer such that the organic EL elements and the colored layers face each other, the color filter substrate further includes a moisture absorbent layer, the moisture absorbent layer being vapor-deposited on the colored layers and facing the resin layer, and the moisture absorbent layer includes magnesium oxide having a refractive index of 1.5 to 1.65 for light with a wavelength of 550 nm, and the moisture absorbent layer has a refractive index of lower than 1.72 for light with a wavelength of 550 nm.

Further another aspect of the present disclosure provides a color filter substrate comprising: a translucent substrate; colored layers disposed on the translucent substrate; and a moisture absorbent layer that is vapor-deposited on the colored layers and contains magnesium oxide, wherein a temperature of the translucent substrate during vapor deposition of the moisture absorbent layer is 200 degrees Celsius or lower.

Still another aspect of the present disclosure provides a manufacturing method of an organic EL panel, the manufacturing method comprising the steps of forming organic EL elements on a first substrate to form an organic EL substrate; forming colored layers on a second substrate, and then vapor-depositing a moisture absorbent layer containing magnesium oxide to form a color filter substrate; and adhering the organic EL substrate and the color filter substrate to each other via a resin layer such that the organic EL elements and the colored layers face each other, wherein a temperature of the second substrate during vapor deposition of the moisture absorbent layer is 200 degrees Celsius or lower.

Also, according to the still other aspect of the present disclosure, an oxygen concentration in a vapor deposition atmosphere during the vapor deposition is 0.02 Pa to 0.09 Pa.

<Process by which the Disclosure was Achieved>

The inventors earnestly conducted many researches in order to apply magnesium oxide to a moisture absorbent layer included in a CF substrate because magnesium oxide is excellent in both transparency and moisture absorption property. As a result, the inventors found that vapor deposition at the substrate temperature of 200 degrees Celsius or lower allows formation of magnesium oxide whose refractive index is lower than that of conventional and common magnesium oxide and is close to that of a resin material commonly used for a resin layer. Then, by using a moisture absorbent layer containing this magnesium oxide, the inventors conceived of the invention of an organic EL panel in which thermal degradation of colored layers included in a CF substrate is suppressed and decrease of the utilization efficiency of emitted light is suppressed.

<Organic EL Panel 1>

Figure 1:
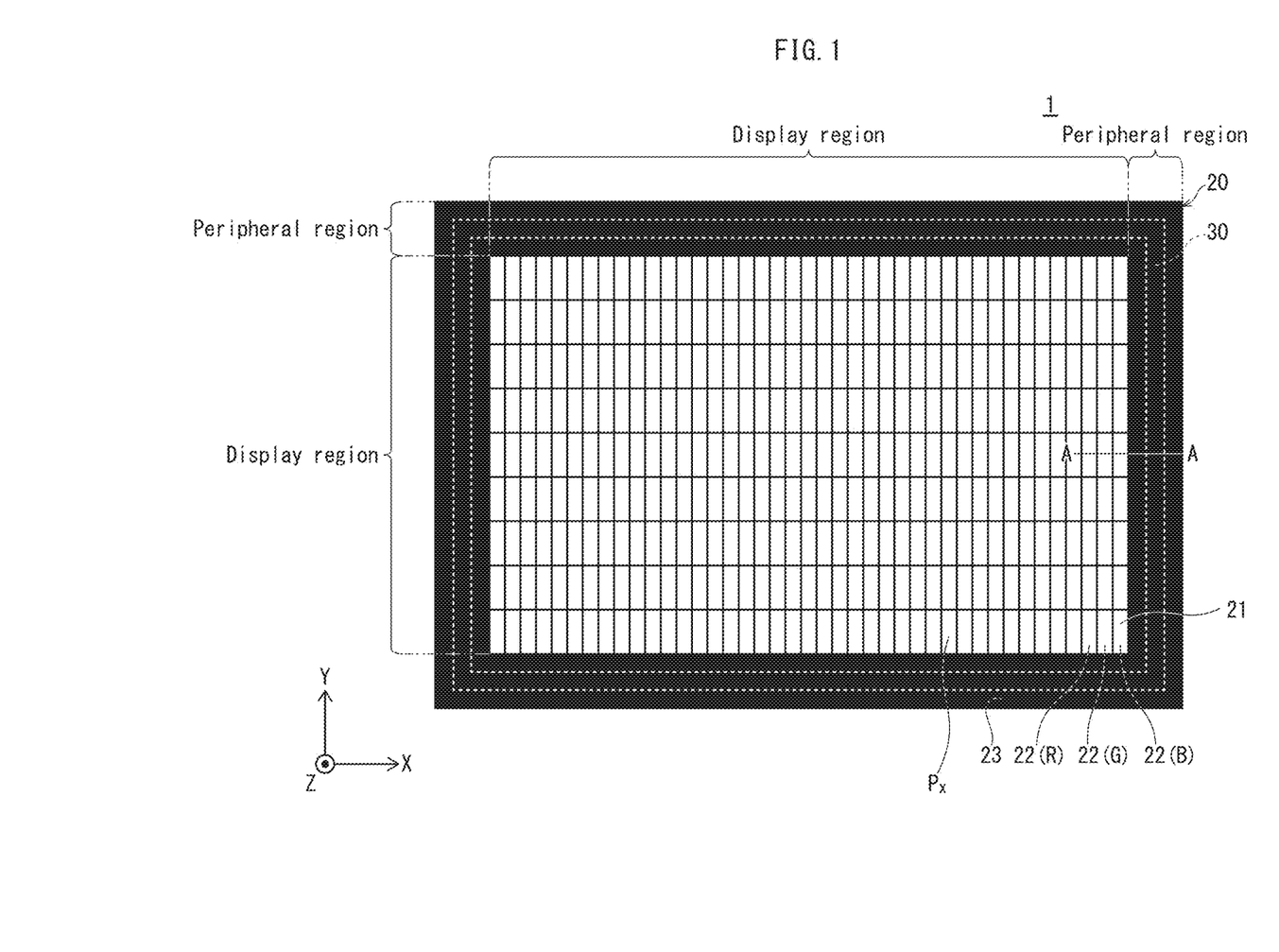
FIG. 1 is a front view showing an organic EL panel 1 relating to an embodiment.
Figure 2:
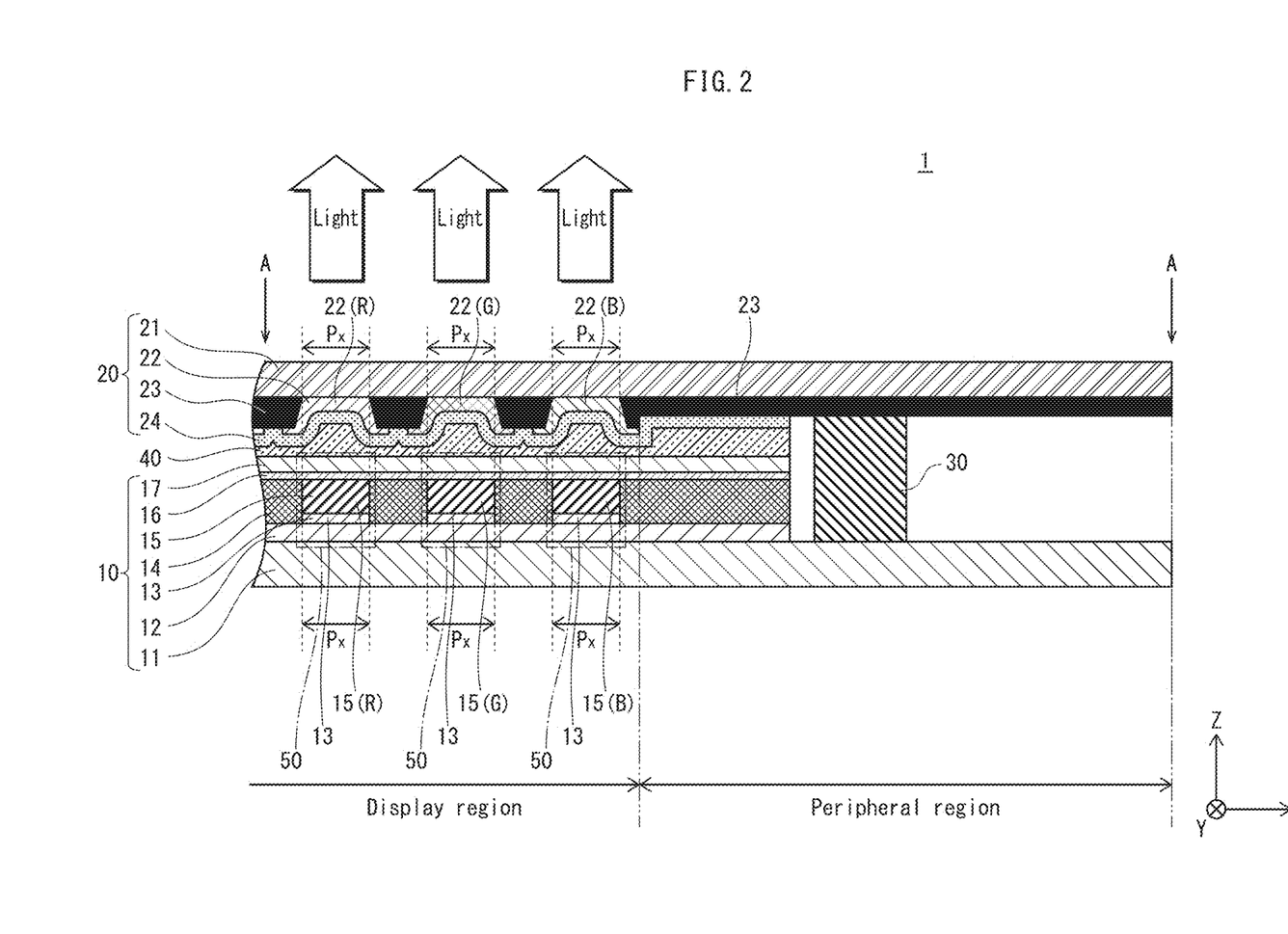
FIG. 2 is a cross-sectional view showing part of the organic EL panel 1 relating to the embodiment, taken along a line A-A in FIG. 1.

FIG. 1 is a front view showing an organic EL panel 1 relating to one aspect of the present disclosure. FIG. 2 is a cross-sectional view showing part of the organic EL panel 1 taken along a line A-A in FIG. 1. As shown in FIG. 2, the organic EL panel 1 includes an organic EL substrate 10 and a CF substrate 20 that face each other and are adhered to each other via a resin layer 40. As shown in FIG. 1, a passivation member 30 is disposed so as to surround a display region where organic EL elements 50 are formed. The organic EL panel 1 is of a so-called top emission type, and light emitted therefrom is extracted in the +Z direction in FIG. 2. Pixels Px are arranged in a matrix in the display region of the organic EL panel 1.

<Organic EL Substrate 10>

The organic EL substrate 10 is explained below with reference to FIG. 2. The organic EL substrate 10 includes, on a thin-film transistor (TFT) substrate 11 on which TFT elements (not shown) are formed in units of pixels Px, organic EL elements 50 each of which is composed of an interlayer insulating film 12, an anode 13, a light-emitting layer 15, a cathode 16, and a passivation layer 17. A bank 14 is formed so as to extend between each adjacent organic EL elements 50 and between the interlayer insulating film 12 and the cathode 16. Also, in the display region of the organic EL substrate 10, the organic EL elements 50, each of which has any one of the light-emitting layer 15(R) emitting red light, the light-emitting layer 15(G) emitting green light, and the light-emitting layer 15(B) emitting blue light, are arranged in parallel in units of pixels Px.

The TFT substrate 11 is made of an insulating material such as non-alkali glass, soda glass, nonfluorescent glass, phosphate glass, borate glass, quartz, acrylic resin, styrenic resin, polycarbonate resin, epoxy resin, polyethylene, polyester, silicone resin, and alumina. The TFT substrate 11 has an upper surface on which the TFTs and various types of electrode wirings are formed with use of a predetermined pattern.

The interlayer insulating film 12 is made of polyimide resin or the like, and is provided in order to insulate between the TFTs and the anodes 13 and between the electrode wirings and the anodes 13 and flatten unevenness due to the TFTs and so on.

The anodes 13 are made of a light-reflective conductive material such as aluminum, silver, alloy of silver, palladium, and copper (APC), alloy of silver, rubidium, and gold (ARA), alloy of molybdenum and chromium (MoCr), and alloy of nickel and chromium (NiCr). The anodes 13 are formed in a matrix in units of pixels Px.

The bank 14 is made of an insulating organic material such as acrylic resin, polymide resin, and novolac phenolic resin, and is formed in regions where the anodes 13 are not formed. The bank 14 relating to the present embodiment is a pixel bank which is composed of line parts extending in the X direction and line parts extending in the Y direction. Alternatively, the bank 14 may be a line bank which is composed only line parts extending in the Y direction.

The light-emitting layers 15 are formed in respective regions corresponding one-to-one to the pixels Px defined by the bank 14. When the organic EL panel 1 is driven, the light-emitting layers 15 each emit light of any one of R, G, and B colors through recombination of holes and electrons. The light-emitting layers 15 are made of an organic material. Examples of the organic material include fluorescent substance disclosed in Japanese Patent Application Publication No. H5-163488 such as oxinoid compound, perylene compound, coumarin compound, azacouramin compound, oxazole compound, oxadiazole compound, perinone compound, pyrrolopyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylenepyran compound, dicyanomethylenethiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of 8-hydroxyquinoline compound, metal complex of 2-bipyridine compound, complex of Schiff base and group III metal, oxine metal complex, and rare earth complex.

The light-emitting layers 15 may each include any or all of a hole injection layer, a hole transport layer, an electron injection layer, and an electron transport layer, as necessary.

The cathodes 16 are transparent electrodes made of a translucent material such as indium tin oxide (ITO) and indium zinc oxide (IZO), and are formed on the respective light-emitting layers 15.

The passivation layer 17 is provided in order to cover the display region to prevent the light-emitting layers 15 from being exposed to moisture, air, and so on. The passivation layer 17 is made of a light-transmissive material such as silicon nitride and silicon oxynitride, and is formed on the cathodes 16.

<CF Substrate 20>

The CF substrate 20 is explained below with reference to FIG. 2. The CF substrate 20 includes respective colored layers 22 of the R, G, and B colors and a black matrix (hereinafter, abbreviated as BM) layer 23 that are sequentially formed on a glass substrate 21 (on a main surface of the glass substrate 21 facing the organic EL substrate 10). The CF substrate 20 further includes a moisture absorbent layer 24 that is formed over substantially the entire display region so as to cover the colored layers 22 and the BM layer 23.

The colored layers 22 are translucent layers that transmit visible light with wavelengths of the R, G, and B colors, and are made of a known resin material (for example, the color resist manufactured by JSR Corporation) or the like. The colored layers 22 are formed in the respective regions corresponding one-to-one to the pixels Px.

The BM layer 23 is provided in order to prevent external light from entering the organic EL panel 1, prevent components inside the organic EL panel 1 from being seen through the CF substrate 20, prevent external light from reflecting and thereby to improve the contrast in the organic EL panel 1, and so on. The BM layer 23 is made of black resin such as ultraviolet curable resin containing black pigment having excellent light absorbing property and light shielding property.

As shown in FIG. 1, the BM layer 23 is formed in the display region of the organic EL substrate 10 and a surrounding region of the organic EL substrate 10 (a region surrounding the display region in FIG. 1). Note that, in the display region, the BM layer 23 is formed in only part where the bank 14 is formed. That is, in the display region, the BM layer 23 is composed of line parts extending in the X direction and line parts extending in the Y direction.

Next, explanation is given on the moisture absorbent layer 24 that is included in the CF substrate 20 so as to cover the colored layers 22 and the BM layer 23. In the present embodiment, the moisture absorbent layer 24 is made of magnesium oxide having both transparency and moisture absorption property. Alternatively, the moisture absorbent layer 24 may be made of oxide of alkaline-earth metal oxide containing magnesium oxide. For example, the moisture absorbent layer 24 may be made of composite oxide of magnesium oxide and calcium oxide, composite oxide of magnesium oxide and strontium oxide, or composite oxide of magnesium oxide, calcium oxide, and strontium oxide. The moisture absorption property increases in the order of magnesium oxide, calcium oxide, and strontium oxide. Further alternatively, mixture of magnesium oxide and resin or the like may be used.

The moisture absorbent layer 24, which is made of magnesium oxide, should preferably have a thickness of 0.1 μm to 10 μm. A thickness of 0.1 μm or more exhibits an excellent absorption property, and a thickness of 10 μm or less prevents occurrence of cracks in the moisture absorbent layer 24.

<Passivation Member 30>

The passivation member 30 is made of a dense resin material such as silicone resin and acrylic resin or glass, and is provided between the organic EL substrate 10 and the CF substrate 20 so as to surround the display region of the organic EL substrate 10. This structure passivates the display region of the organic EL substrate 10 to prevent the organic EL elements 50 from being exposed to moisture, air, and so on. Note that the passivation member 30 is not essential for the organic EL panel 1 relating to the one aspect of the present disclosure, and may be omitted if a masking tape or the like is used.

The passivation member 30 includes a spacer (not shown) that defines a space between the organic EL substrate 10 and the CF substrate 20 which face each other. The spacer is made of a material such as silica, has a shape such as cylinder, rectangular solid, and sphere. The spacer has respective ends thereof that are in abutment with the organic EL substrate 10 and the CF substrate 20. Note that provision of the spacer in the passivation member 30 is not essential for the organic EL panel 1 relating to the one aspect of the present disclosure.

<Manufacturing Method of Organic EL Panel 1>

A common method is used for manufacturing the organic EL substrate 10 having the layer structure in which is the organic EL elements 50 are formed on the TFT substrate 11.

As described above, the CF substrate 20 is formed by sequentially forming the respective colored layers 22 of the R, G, and B colors and the BM layer 23 on the glass substrate 21 by a common photolithography method. Then, the moisture absorbent layer 24, which is made of magnesium oxide, is formed over substantially the entire display region by an electron beam (EB) vapor deposition method. The temperature of the CF substrate 20 during vapor deposition is set to 200 degrees Celsius or lower in consideration of thermal resistance of the colored layers 22. The colored layers 22 included in the CF substrate 20 cannot withstand heat at a temperature of higher than 200 degrees Celsius, and as a result degrades. Accordingly, the upper limit temperature of the CF substrate 20 is set to 200 degrees Celsius. The lower limit temperature of the CF substrate 20 is not particularly set. However, even while not being heated, the CF substrate 20 is presumed to have a temperature of 100 degrees Celsius or higher due to radiation heat during EB vapor deposition. Since the temperature of the CF substrate 20 during EB vapor deposition seems to reach at least 100 degrees Celsius as described above, it is impossible to deposit the moisture absorbent layer 24 on the side of the organic EL substrate 10. This is because the radiation heat at approximate 100 degrees Celsius degrades the organic EL elements 50. Also, the temperature of the CF substrate 20 during vapor deposition is set to 200 degrees Celsius or lower because the colored layers 22 can withstand heat, and the refractive index of the moisture absorbent layer 24 can be decreased and thereby the difference in refractive index between the moisture absorbent layer 24 and the resin layer 40 can be decreased. Further, the temperature of the CF substrate 20 of 200 degrees Celsius or lower allows to approximate the orientation of the crystal lattice of magnesium oxide as the moisture absorbent layer 24 to the (111) orientation. (111)-oriented crystal layers are more porous than (100)-oriented ones and so on, and this preferably improves the capability of absorbing moisture and so on. Further, an oxygen concentration in a vapor deposition atmosphere during vapor deposition should preferably be 0.02 Pa to 0.09 Pa. The oxygen concentration of 0.02 Pa or higher allows further efficient introduction of oxygen into the moisture absorbent layer 24 to reduce oxygen defects. As a result, the (111) orientation is obtained. Increase of the oxygen concentration in the vapor deposition atmosphere further facilitates to obtain the (111) orientation. Similarly, the oxygen concentration of 0.09 Pa or lower allows further efficient introduction of oxygen into the moisture absorbent layer 24 to reduce oxygen defects. As a result, the (111) orientation is obtained. Although the method of forming the moisture absorbent layer 24 by vapor deposition is explained above, sputtering may alternatively be employed.

The passivation member 30 is rendered by a dispenser in the surrounding region of either the organic EL substrate 10 or the CF substrate 20, which are prepared. Then, the resin layer 40 is formed over substantially the entire display region of the organic EL substrate 10. The resin layer 40 acts as an adhesive between the organic EL substrate 10 and the CF substrate 20, and is made of heat curable epoxy resin. However, without limiting to this, the resin layer 40 may be made of ultraviolet curable epoxy resin or other organic material such as acrylic resin. Then, the organic EL elements 50 and the colored layers 22 are aligned, and the organic EL substrate 10 and the CF substrate 20 are adhered to each other via the resin layer 40. After adherence, the organic EL panel 1 is baked in an oven at approximate 100 degrees Celsius to cure the passivation member 30 and the resin layer 40.

As a result, the organic EL panel 1 is complete.

<Effects of Moisture Absorbent Layer 24>

Figure 3:
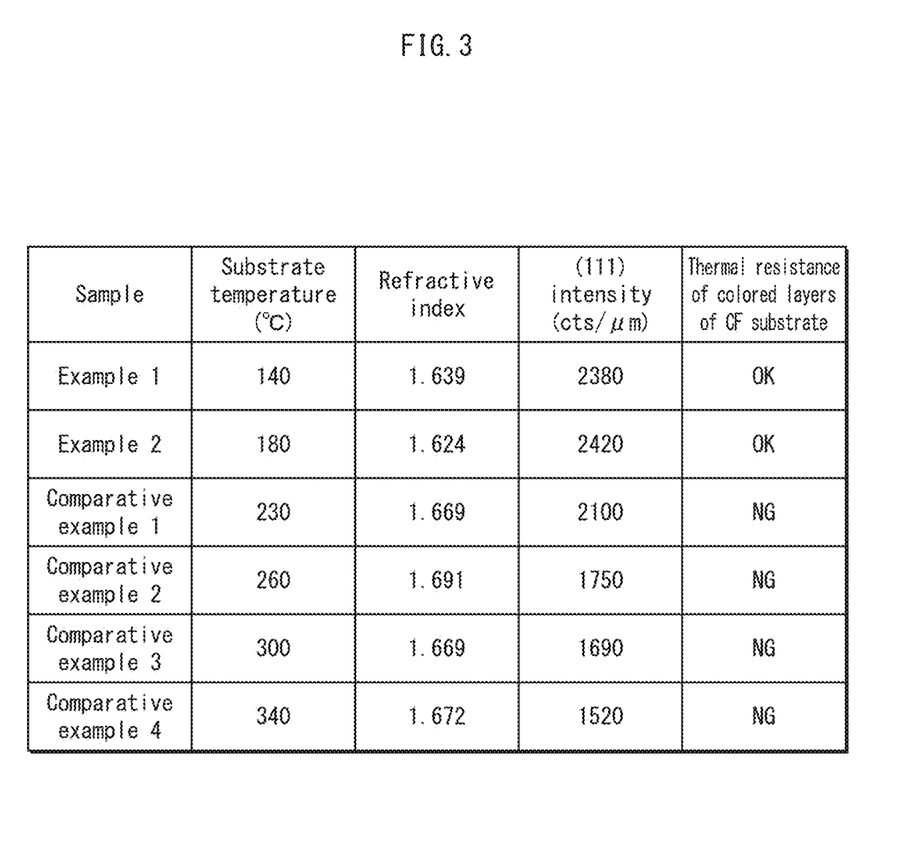
FIG. 3 shows substrate temperature, measured values, and thermal resistance of colored layers included in a CF substrate with respect to samples in Examples and Comparative examples.

In order to study effects of magnesium oxide, which is used as the moisture absorbent layer 24 relating to the present embodiment, six samples were prepared as shown in FIG. 3, which differ in temperature of the glass substrate from each other taking into consideration the upper limit temperature of 200 degrees Celsius at which the colored layers included in the CF substrate can withstand. For simplification, only a film of magnesium oxide is formed on a glass substrate on which neither colored layer nor BM layer is formed. Examples 1 and 2 are each a sample in which EB vapor deposition was performed at the substrate temperature of 200 degrees Celsius or lower, which falls within the range of the substrate temperature in the present embodiment. Comparative examples 1-4 are each a sample in which EB vapor deposition was performed at the substrate temperature of higher than 200 degrees Celsius, which higher than the range of the substrate temperature in the present embodiment. Accordingly, the substrate temperature in Examples 1 and 2 is a temperature condition the colored layers included in the CF substrate can withstand, and the substrate temperature in Comparative examples 1-4 is a temperature condition the colored layers included in the CF substrate cannot withstand. FIG. 3 shows refractive index, measured values of (111) intensity, thermal resistance of the colored layers included in the CF substrate (OK/NG), with respect to the samples. The refractive index is for light with a wavelength of 550 mm. The refractive index in the present Description is all for light with a wavelength of 550 nm.

Figure 4:
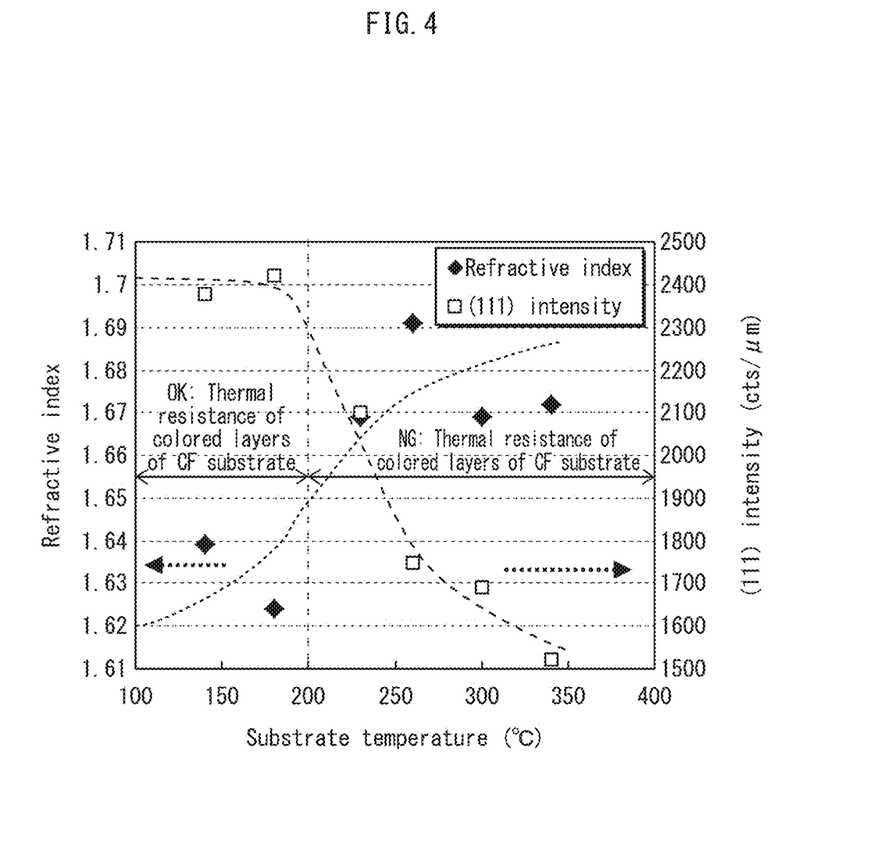
FIG. 4 is a graph showing a relationship between substrate temperature, refractive index, and (111) intensity with respect to samples in Examples and Comparative examples.

FIG. 4 is a graph showing a relationship between the substrate temperature, the refractive index, and the (111) intensity. First, the refractive index is explained. Examples 1 and 2, which have the substrate temperature of 200 degrees Celsius or lower the colored layers included in the CF substrate can withstand, have a refractive index of around 1.63. On the other hand, Comparative examples 1-4, which have the substrate temperature of higher than 200 degrees Celsius the colored layers included in the CF substrate cannot withstand, have a refractive index of around 1.68. Based on these experimental values, magnesium oxide is estimated to have a refractive index of 1.65 at the substrate temperature of 200 degrees Celsius, which is the border between OK and NG in thermal resistance of the colored layers included in the CF substrate. FIG. 4 demonstrates that the refractive index also greatly decreases at the substrate temperature of 200 degrees Celsius or lower. Accordingly, by setting the substrate temperature to 200 degrees Celsius or lower, it is possible to set the refractive index of magnesium oxide to 1.65, which is lower than 1.72 that is a conventional and common value for the refractive index of magnesium oxide. This is the fact achieved as a result of the inventors' earnest experiments. The average refractive index of resin seems to 1.5 though depending on materials. The smaller the difference in refractive index between magnesium oxide and resin is, the more the interface reflection is suppressed, and as a result decrease of the light utilization efficiency is suppressed. Therefore, by performing vapor deposition at the substrate temperature 200 degrees Celsius or lower, it is possible to manufacture magnesium oxide having a refractive index of 1.65, which is lower than that of conventional and common one and is close to the average refractive index of resin.

Note that, although no experiment was made at the substrate temperature of lower than 140 degrees Celsius, the lower limit of the refractive index of magnesium oxide should be set to 1.5, which is the same as that of magnesium oxide. In this case, no difference exists in refractive index between magnesium oxide and resin. Although the lower limit of the refractive index of magnesium oxide should preferably be 1.5, which is the same as that of magnesium oxide for this reason, the real lower limit of the refractive index of magnesium oxide is 1.62 within the range of the experiments made in the present embodiment.

Note that it is difficult to determine whether or not vapor deposition of magnesium oxide was performed at the substrate temperature of 200 degrees Celsius or lower, even by checking the samples. However, the present inventors believes that a measured refractive index of 1.65 or lower can indirectly prove that vapor deposition was performed at the substrate temperature of 200 degrees Celsius or lower. If any alleged infringement goods appear in the future, the refractive index of the moisture absorbent layer should be measured.

Next, explanation is given on the (111) intensity shown in FIG. 4. The (111) intensity indicates a value measured by X-ray crystallography called X-ray diffraction (XRD). This method showed the orientation of arrangement of atoms inside a crystal. Here, the peak of the (111) orientation was measured, and accordingly the higher the (111) intensity is, the more the atoms are (111)-oriented. This graph demonstrates that while the (111) intensity is stable at a high value when the substrate temperature is 200 degrees Celsius or lower in such as Examples 1 and 2, the (111) intensity rapidly decreases when the substrate temperature is higher than 200 degrees Celsius in such as Comparative examples 1-4.

Figure 5A:
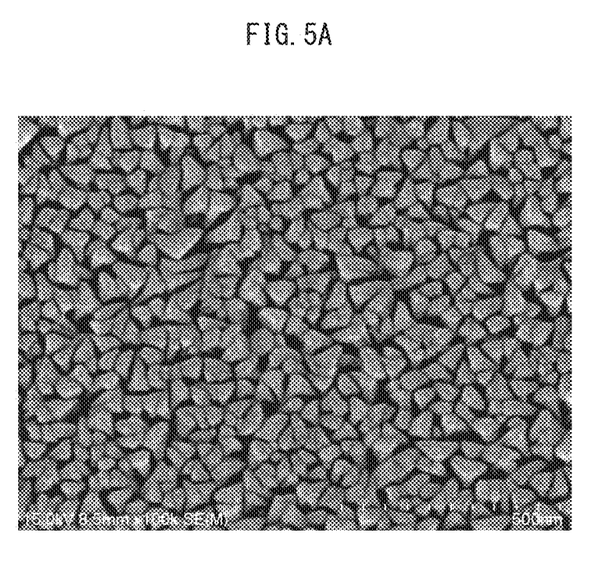
FIG. 5A shows an SEM photograph of (111)-oriented magnesium oxide crystals.
Figure 5B:
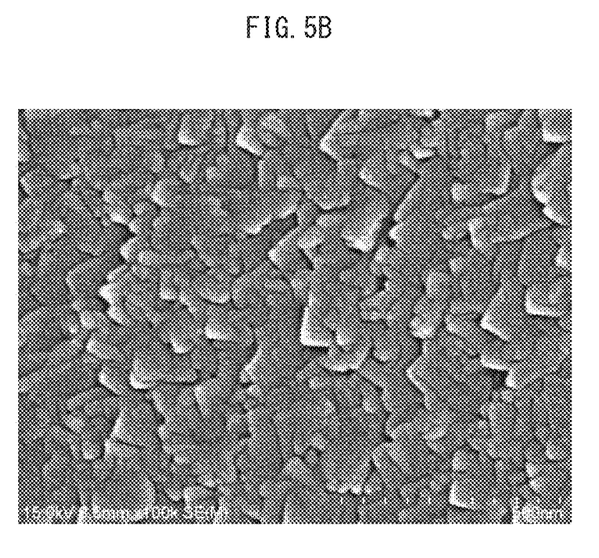
FIG. 5B shows an SEM photograph of (100)-oriented magnesium oxide crystals.

Just for reference, FIG. 5A shows an SEM photograph of a (111)-oriented magnesium oxide thin film, and FIG. 5B shows an SEM photograph of a (100)-oriented magnesium oxide thin film. While (100)-oriented crystals are as if they were laid, (111)-oriented crystals are as if crystals stood up in a columnar arrangement and many spaces exist therebetween. Accordingly, it seems that Examples 1 and 2, which have the (111) orientation, have a further improved property of absorbing moisture and so on.

Figure 6:
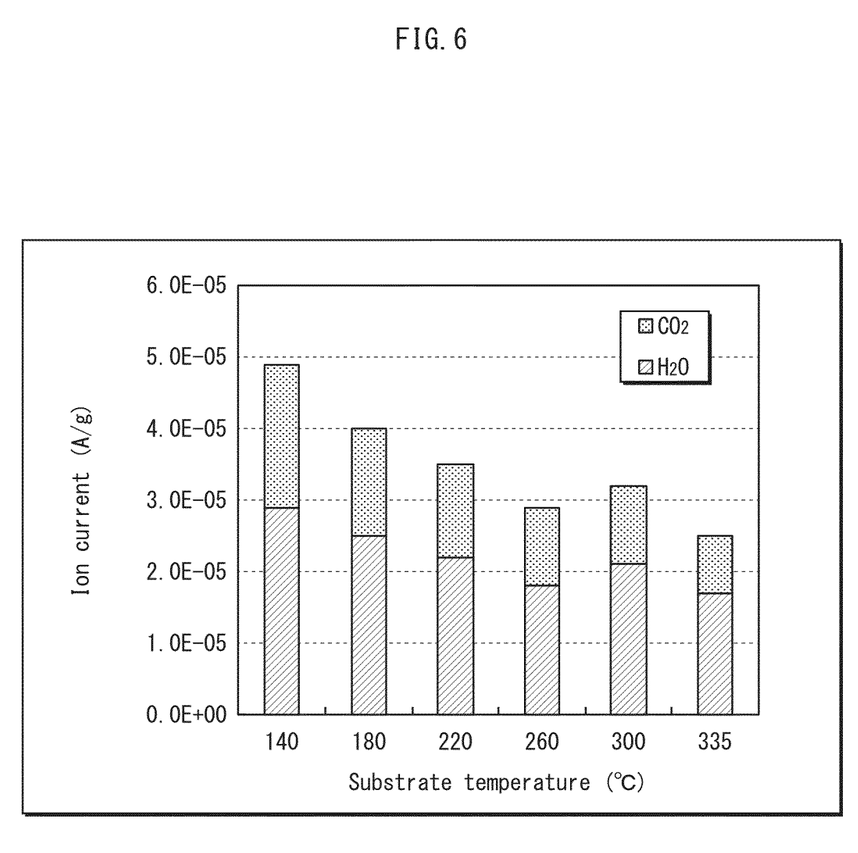
FIG. 6 is a graph showing a relationship between substrate temperature and ion current with respect to samples in Examples and Comparative examples.

FIG. 6 is a graph showing a relationship between the substrate temperature and the ion current. The ion current indicates a value measured by a mass spectrometry called thermal desorption spectrometry (TDS). As this value increases, a desorption amount of gas increases. In other words, as this value increases, an amount of the gas included in the sample increases. This Examples 1 and 2, which have the substrate temperature of 200 degrees Celsius or lower, contain more amount of moisture and so on than other samples, which have the substrate temperature of higher than 200 degrees Celsius.

As described above, by setting the substrate temperature at which a moisture absorbent layer containing magnesium oxide is vapor-deposited to 200 degrees Celsius or lower, it is possible to obtain a moisture absorbent layer having a refractive index of 1.65 or lower. This realizes an organic EL panel in which thermal degradation of colored layers included in a CF substrate is suppressed and decrease of utilization efficiency of emitted light is suppressed.

INDUSTRIAL APPLICABILITY

The present disclosure is utilizable for organic EL panels employing the CF method.

REFERENCE SIGNS LIST 1 organic EL panel
10 organic EL substrate
11 first substrate
20 CF substrate
21 second substrate
22 colored layer
24 moisture absorbent layer
40 resin layer
50 organic EL element

The invention claimed is:

1. An organic EL panel comprising:
an organic EL substrate that includes a first substrate and organic EL elements disposed on the first substrate;
a color filter substrate that includes a second substrate and colored layers disposed on the second substrate; and
a resin layer, wherein
the organic EL substrate and the color filter substrate are adhered to each other via the resin layer such that the organic EL elements and the colored layers face each other,
the color filter substrate further includes a moisture absorbent layer, the moisture absorbent layer being vapor-deposited on the colored layers, facing the resin layer, and containing magnesium oxide, and
a temperature of the second substrate during vapor deposition of the moisture absorbent layer is 200 degrees Celsius or lower.

2. The organic EL panel of claim 1, wherein
the moisture absorbent layer further includes at least one of calcium oxide and strontium oxide.

3. The organic EL panel of claim 1, wherein
the magnesium oxide contained in the moisture absorbent layer is (111)-oriented.

4. An organic EL panel comprising:
an organic EL substrate that includes a first substrate and organic EL elements disposed on the first substrate;
a color filter substrate that includes a second substrate and colored layers disposed on the second substrate; and
a resin layer, wherein
the organic EL substrate and the color filter substrate are adhered to each other via the resin layer such that the organic EL elements and the colored layers face each other,
the color filter substrate further includes a moisture absorbent layer, the moisture absorbent layer being vapor-deposited on the colored layers and facing the resin layer, and
the moisture absorbent layer includes magnesium oxide having a refractive index of 1.5 to 1.65 for light with a wavelength of 550 nm, and
the moisture absorbent layer has a refractive index of lower than 1.72 for light with a wavelength of 550 nm.

5. The organic EL panel of claim 4, wherein
the moisture absorbent layer further includes at least one of calcium oxide and strontium oxide.

6. The organic EL panel of claim 4, wherein
the magnesium oxide contained in the moisture absorbent layer is (111)-oriented.

7. A color filter substrate comprising:
a translucent substrate;
colored layers disposed on the translucent substrate; and
a moisture absorbent layer that is vapor-deposited on the colored layers and contains magnesium oxide, wherein
a temperature of the second substrate during vapor deposition of the moisture absorbent layer is 200 degrees Celsius or lower.

8. A manufacturing method of an organic EL panel, the manufacturing method comprising the steps of:
forming organic EL elements on a first substrate to form an organic EL substrate;
forming colored layers on a second substrate, and then vapor-depositing a moisture absorbent layer containing magnesium oxide to form a color filter substrate; and
adhering the organic EL substrate and the color filter substrate to each other via a resin layer such that the organic EL elements and the colored layers face each other, wherein
a temperature of the second substrate during vapor deposition of the moisture absorbent layer is 200 degrees Celsius or lower.

9. The manufacturing method of claim 8, wherein
an oxygen concentration in a vapor deposition atmosphere during the vapor deposition is 0.02 Pa to 0.09 Pa.

\* \* \* \* \*